(12) United States Patent
Tsutsumi et al.

(10) Patent No.: US 7,391,046 B2
(45) Date of Patent: Jun. 24, 2008

(54) LIGHT SOURCE MODULE AND VEHICLE FRONT LAMP

(75) Inventors: Yasuaki Tsutsumi, Shizuoka (JP); Hisayoshi Daicho, Shizuoka (JP); Hitoshi Takeda, Shizuoka (JP); Hidekazu Hayama, Kyoto (JP); Hirokazu Yamaguchi, Kyoto (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 32 days.

(21) Appl. No.: 11/088,909

(22) Filed: Mar. 25, 2005

(65) Prior Publication Data

US 2005/0253130 A1  Nov. 17, 2005

(30) Foreign Application Priority Data

Mar. 26, 2004 (JP) ............... P.2004-093172
Feb. 28, 2005 (JP) ............... P.2005-052893

(51) Int. Cl.
*H01L 29/06* (2006.01)
(52) U.S. Cl. .......................... 257/13; 257/12
(58) Field of Classification Search ............ 257/12, 257/13
See application file for complete search history.

(56) References Cited

U.S. PATENT DOCUMENTS

| 5,541,248 | A | 7/1996 | Haluska et al. |
| 5,777,433 | A | 7/1998 | Lester et al. |
| 6,074,739 | A | 6/2000 | Katagiri |
| 6,614,179 | B1* | 9/2003 | Shimizu et al. ............ 313/512 |
| 6,686,676 | B2 | 2/2004 | McNulty et al. |
| 6,773,787 | B2* | 8/2004 | Maas et al. ................ 428/141 |
| 2006/0029427 | A1* | 2/2006 | Yoshizawa et al. ......... 399/149 |

FOREIGN PATENT DOCUMENTS

| DE | 101 53 259 A1 | 5/2003 |
| EP | 1 331 518 A2 | 7/2003 |
| WO | 01/50540 A1 | 7/2001 |
| WO | 02/089175 A1 | 11/2002 |

OTHER PUBLICATIONS

"Optical Devices", Ohm MOOK Optical Series, No. 1, Ohmsha, Ltd., Nov. 25, 2001, 35 pages.

* cited by examiner

*Primary Examiner*—Long Pham
(74) *Attorney, Agent, or Firm*—Sughrue Mion, PLLC

(57) ABSTRACT

A light source module for generating light, including a semiconductor light-emitting element, nano-particles having a diameter smaller than half the wavelength of light generated by the light source module, a fluorescent substance for generating visible light in accordance with light generated by the semiconductor light-emitting element, and a binder formed stratiformly for covering a light-emitting surface of the semiconductor light-emitting element to hold the nano-particles and the fluorescent substance, wherein the refractive index of the nano-particles is higher than the refractive index of the binder.

13 Claims, 6 Drawing Sheets

LIGHT SOURCE MODULE AND VEHICLE FRONT LAMP

The present invention claims foreign priority to Japanese patent application no. P. 2004-093172, filed on Mar. 26, 2004 and no. P. 2005-052893 filed on Feb. 28, 2005, the contents of which are incorporated herein by reference.

BACKGROUND OF THE PRESENT INVENTION

1. Field of the Present Invention

The present invention relates to a light source module and a vehicle front lamp.

2. Description of the Related Art

A light source module using a semiconductor light-emitting element and a fluorescent substance for generating white light has been heretofore known (e.g. see Ohm MOOK Optical Series No. 1 "Optical Devices" Ohmsha, Ltd., Nov. 25, 2001). The fluorescent substance generates visible light in accordance with light generated by the semiconductor light-emitting element. The fluorescent substance is held in a transparent binder. For example, the fluorescent substance is formed stratiformly on a light-emitting surface of the semiconductor light-emitting element.

If the refractive index of the binder in this type of light source module is low, there is a possibility that the light generated by the semiconductor light-emitting element will be totally reflected on a boundary surface between the semiconductor light-emitting element and the binder when the light generated by the semiconductor light-emitting element is incident to the binder. Consequently, there is a possibility that part of the light generated by the semiconductor light-emitting element will not be applied onto the fluorescent substance in the binder. For this reason, it might be impossible to radiate the light generated by the semiconductor light-emitting element to the outside of the light source module efficiently.

SUMMARY OF THE PRESENT INVENTION

Therefore, an object of the present invention is to provide a light source module and a vehicle front lamp to solve the aforementioned problem.

In order to achieve the aforementioned object, according to a first aspect of the present invention, there is provided a light source module for generating light, comprising:

a semiconductor light-emitting element operable to generate light;

a nano-particle of which diameter is smaller than half wavelength of the light generated by the light source module;

a fluorescent substance for generating visible light in accordance with the light generated by the semiconductor light-emitting element; and a stratiformly binder which covers a light-emitting surface of the semiconductor light-emitting element and holds the nano-particle and the fluorescent substance, wherein a refractive index of the nano-particles is higher than a refractive index of the binder.

According to a second aspect of the present invention as set forth in the first aspect of the present invention, it is preferable that the diameter of the nano-particle is 100 nm or less.

According to a third aspect of the present invention as set forth in the first aspect of the present invention, it is preferable that forbidden bandwidth energy of the nano-particle is 3.54 eV or more.

According to a fourth aspect of the present invention as set forth in the first aspect of the present invention, it is preferable that the refractive index of the binder is 1.5 or less.

According to a fifth aspect of the present invention as set forth in the first aspect of the present invention, it is preferable that the semiconductor light-emitting element generates ultraviolet light, the fluorescent substance generates visible light in accordance with the ultraviolet light generated by the semiconductor light-emitting element and the binder is made of fluorocarbon resin or silicone resin.

According to a sixth aspect of the present invention as set forth in the first aspect of the present invention, it is preferable that the semiconductor light-emitting element generates ultraviolet light, the fluorescent substance generates visible light in accordance with the ultraviolet light generated by the semiconductor light-emitting element, the binder is made of silsesquioxane resin; and a side chain of the silsesquioxane resin is a single substituents or a plurality of substituents, the substituent is selected from at least one of non-aromatic substituents.

According to a seventh aspect of the present invention as set forth in the first aspect of the present invention, it is preferable that the semiconductor light-emitting element generates ultraviolet light, the fluorescent substance generates visible light in accordance with the ultraviolet light generated by the semiconductor light-emitting element, the binder includes a monomer component of silicone compound represented by chemical formula: $R_{(4-n)}\text{—SiX}_n$ in which R is a substituent containing an H atom or an F, B, N, Al, P, Si, Ge or Ti atom or an organic group having 1-50 carbon atoms, X is a hydrolytic group and n is an integer of 0 to 4; and wherein a ratio of the monomer component which corresponds to the silicone compound represented by the chemical formula at n=3 and 4 is 20 wt % or more.

According to an eighth aspect of the present invention as set forth in the first aspect of the present invention, it is preferable that the light source module further comprising a sealing member which holds the nano-particles and is formed so as to cover the binder and the semiconductor light-emitting element from a visible light-transmissible material to thereby seal the binder and the semiconductor light-emitting element.

According to a ninth aspect of the present invention as set forth in the first aspect of the present invention, it is preferable that the light source module further comprising:

a sealing member which is made of visible light-transmissible material and covers the binder and the semiconductor light-emitting element so as to seal the binder and the semiconductor light-emitting element, wherein the refractive index of the binder, which holds the nano-particle and the fluorescent substance, is smaller than a refractive index of the semiconductor light-emitting element and larger than a refractive index of the sealing member.

According to a tenth aspect of the present invention as set forth in the ninth aspect of the present invention, it is preferable that the refractive index of the binder, which holds the nano-particle and the fluorescent substance, is 1.5 or more and 2.5 or less.

According to an eleventh aspect of the present invention, there is provided a vehicle front lamp used in a vehicle, comprising:

a light source module for generating light, the light module includes:

a semiconductor light-emitting element;

a nano-particle each having a diameter smaller than half wavelength of light generated by the light source module;

a fluorescent substance for generating visible light in accordance with the light generated by the semiconductor light-emitting element; and a stratiformly binder which covers a light-emitting surface of the semiconductor light-emitting element and holds the nano-particle and the fluorescent substance, and an optical member for radiating the light generated by the light source module to an outside of the vehicle front lamp, wherein a refractive index of the nano-particle is higher than a refractive index of the binder.

According to a twelfth aspect of the present invention as set forth in the fifth aspect of the present invention, it is preferable that the fluorocarbon resin is selected from at least one of polytetrafluoroethylene (PTFE), tetrafluoroethylene or hexafluoropropylene copolymer (FEP), tetrafluoroethylene or perfluoroalkylvinyl ether copolymer (PFA), polychlorotrifluoroethylene (PCTFE), polyvinyl fluoride-ethylene or tetrafluoroethylene copolymer (ECTFE), vinylidene fluoride (VDF), hexafluoropropylene (HFP), pentafluoropropylene (PFP) and perfluoromethylvinyl ether (PFMVE).

According to a thirteenth aspect of the present invention as set forth in the sixth aspect of the present invention, it is preferable that the silsesquioxane resin is selected from at least one of $[RSiO_{3/2}]n$ or $[RSi(OH)O_{2/2}]m[RSiO_{3/2}]n$, wherein R is a substituent except an aromatic substituent.

According to a fourteenth aspect of the present invention as set forth in the sixth aspect of the present invention, it is preferable that the substituent is selected from at least one of alkyl group, amino group, carboxyl group, and halogen.

According to a fifteenth aspect of the present invention as set forth in the seventh aspect of the present invention, it is preferable that the silicone compound is selected from at least one of tetramethoxysilane $Si(OCH_3)_4$, tetraethoxysilane $Si(OC_2H_5)_4$, trimethoxysilane $HSi(OCH_3)_3$, triethoxysilane $HSi(OC_2H_5)_3$, methyltrichlorosilane $CH_3SiCl_3$, ethyltrichlorosilane $C_2H_5SiCl_3$, $(CH_2Cl)SiCl_3$, $C_6H_5SiCl_3$, $SiCl_4$, $HSiCl_3$, $CF_3C_2H_4SiCl_3$, vinyltriethoxysilane, 3-methacryloxypropyltrimethoxysilane, 3-glycidoxypropyltrimethoxysilane, 2-(3,4-epoxycyclohexyl)ethyltrimethoxysilane, N-2 (aminoethyl)-3-aminopropyltrimethoxysilane, 3-aminopropyltriethoxysilane, N-phenyl-3-aminopropyltrimethoxysilane, 3-mercaptopropyltrimethoxysilane and 3-chloropropyltrimethoxysilane.

According to a sixteenth aspect of the present invention as set forth in the eighth aspect of the present invention, it is preferable that the sealing member is made of epoxy resin is selected from at least one of bisphenol A epoxy (transparent epoxy), biphenyl epoxy and alicyclic epoxy.

According to a seventeenth aspect of the present invention as set forth in the first aspect of the present invention, it is preferable that the nano-particle is at least one of aluminum oxide, antimony trioxide, beryllium oxide, hafnium dioxide, lanthanum oxide, magnesium oxide, scandium oxide, silicone dioxide, silicone trioxide, tantalum pentaoxide, titanium dioxide, thorium oxide, yttrium oxide, zirconium dioxide, bismuth trifluoride, cerium fluoride, lanthanum fluoride, lead fluoride, neodymium fluoride, sodium fluoride, calcium fluoride, chiolyte, cryolite, lithium fluoride, magnesium fluoride, lead chloride and lead telluride.

According to an eighteenth aspect of the present invention as set forth in the first aspect of the present invention, it is preferable that the fluorescent substance generates light which is complementary color with the light generated by the light source module.

According to a nineteenth aspect of the present invention as set forth in the sixth aspect of the present invention, it is preferable that a refractive index of the nano-particle is larger than a refractive index of the sealing member.

Incidentally, the summary of the present invention is not for description of all necessary features of the present invention. Sub-combination of these features may be used for the present invention.

DETAILED DESCRIPTION OF THE PREFERRED EMBODIMENTS

The present invention will be described below through embodiments thereof. The following embodiments are not for limiting the present invention concerned with the scope of claims. All combinations of features described in the embodiments need not be essential to solutions due to the present invention.

Figure 1:
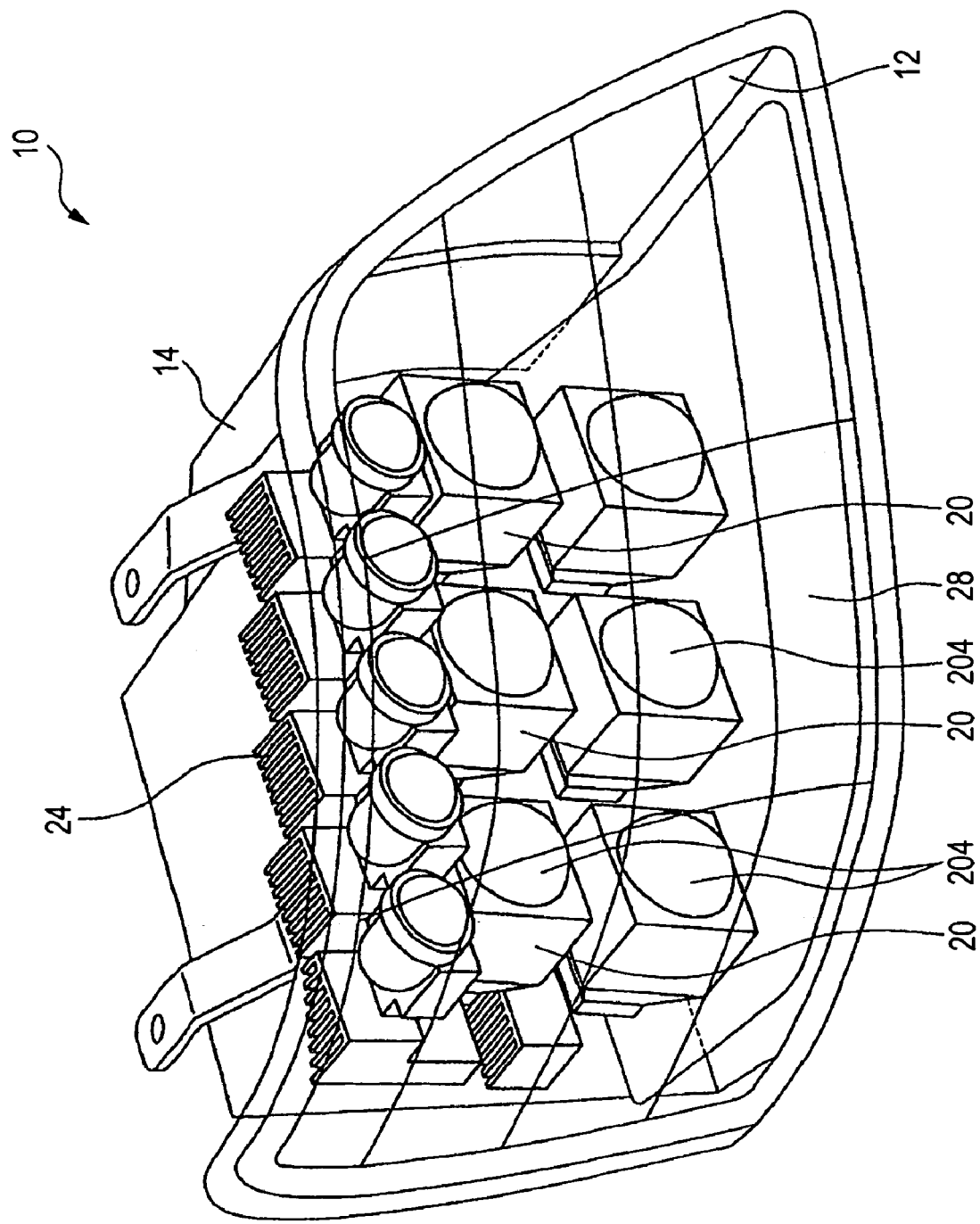
FIG. 1 is a perspective view of a vehicle front lamp 10.
Figure 2:
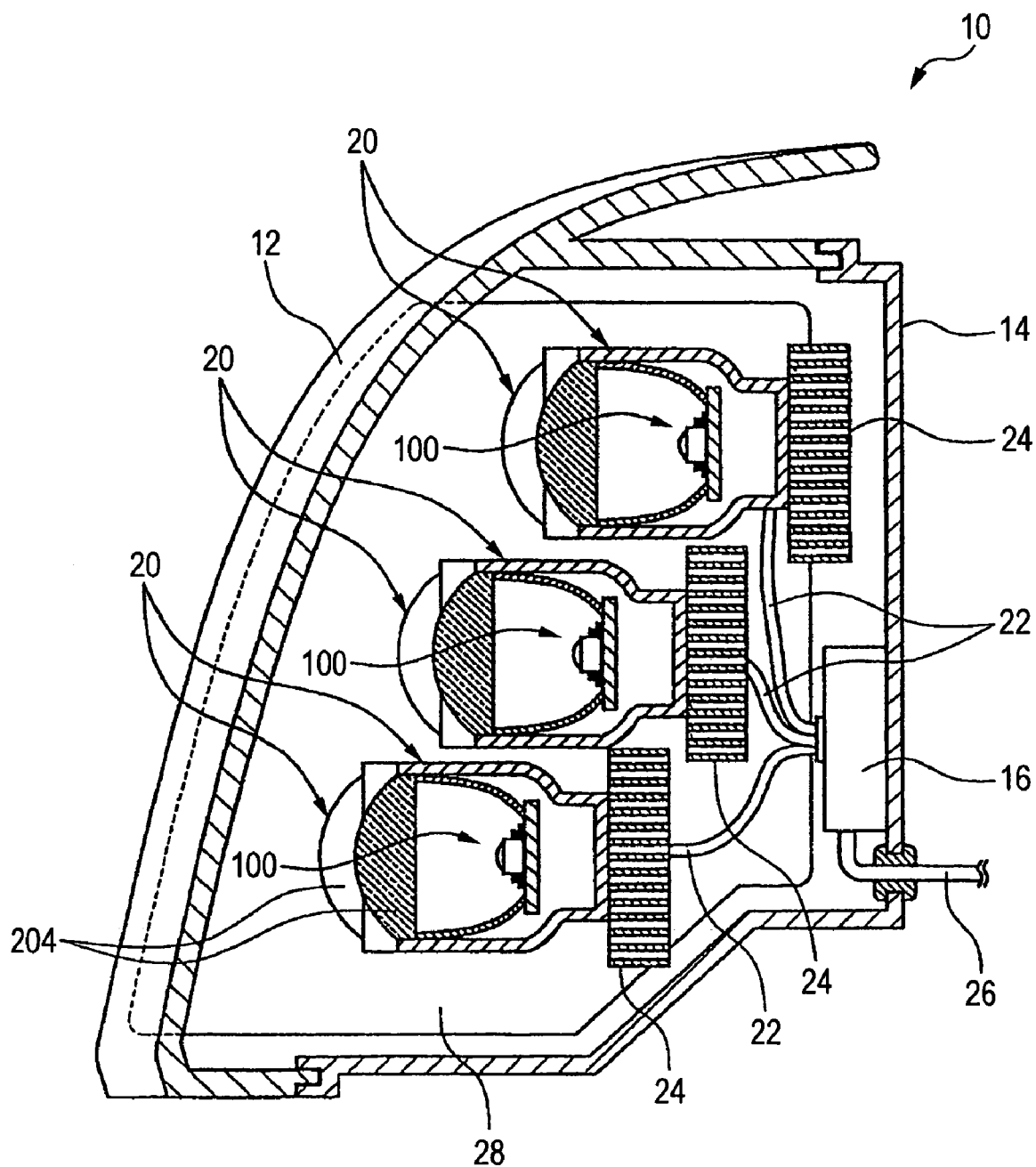
FIG. 2 is a horizontal sectional view of the vehicle front lamp 10.

FIGS. 1 and 2 show an example of configuration of a vehicle front lamp 10 according to an embodiment of the present invention. FIG. 1 is a perspective view of the vehicle front lamp 10. FIG. 2 is a horizontal sectional view of the vehicle front lamp 10 based on a horizontal plane crossing light source units 20 in a middle stage. An object of this embodiment is to provide the vehicle front lamp 10 with high light-emitting efficiency in such a manner that light generated by semiconductor light-emitting elements included in the vehicle front lamp 10 is taken out to the outside efficiently. For example, the vehicle front lamp 10 is a headlamp used in a car or the like. The vehicle front lamp 10 radiates light in front of a vehicle. The vehicle front lamp 10 includes light source units 20, a cover 12, a lamp body 14, a circuit unit 16, heat-radiating members 24, an extension reflector 28, and cables 22 and 26.

Each of the light source units 20 has an LED module 100, and a lens 204. The LED module 100 is an example of the light source module according to the present invention. The LED module 100 generates white light in accordance with electric power received from the circuit unit 16 through the cable 22. The lens 204 is an example of the optical member in the present invention. The lens 204 radiates the light generated by the LED module 100 to the outside of the vehicle front lamp 10. Accordingly, the light source units 20 radiate light forming a part of a vehicle luminous intensity distribution pattern ahead of the vehicle on the basis of the light generated by the LED modules 100. For example, each light source unit 20 is supported by the lamp body 14 so that the light source unit 20 can be tilted by an aiming mechanism for adjusting the direction of an optical axis of the light source unit 20. Each light source unit 20 may be supported by the lamp body 14 so that the direction of the optical axis is inclined downward at an angle, for example, of about 0.3° to 0.6° when the vehicle front lamp 10 is attached to a vehicle body.

The light source units 20 may have the same or like luminous intensity distribution characteristics or may have different luminous intensity distribution characteristics. As another example, one light source unit 20 may have a plurality of LED modules 100. As the light source module used in the light source unit 20, a semiconductor laser may be used in place of the LED module 100.

The cover 12 and the lamp body 14 form a lamp chamber of the vehicle front lamp 10. The light source units 20 are stored in the lamp chamber. It is preferable that the cover 12 and the lamp body 14 keep the light source units 20 airtight and waterproof. For example, the cover 12 is made of a material capable of transmitting light generated by the LED modules 100, so that light can pass through the cover 12 entirely. The cover 12 is provided in the front of the vehicle so that the light source units 20 are covered with the cover 12 from the front of the light source units 20. The lamp body 14 is provided opposite to the cover 12 with respect to the light source units 20 so that the light source units 20 are covered with the lamp body 14 from the back of the light source units 20. The lamp body 14 may be formed so as to be integrated with the vehicle body.

The circuit unit 16 is a module in which switching circuits or the like are formed for switching on the LED modules 100. The circuit unit 16 is electrically connected to the light source units 20 through the cable 22. The circuit unit 16 is also electrically connected to the outside of the vehicle front lamp 10 through the cable 26.

The heat-radiating members 24 are heat sinks each of which is provided so as to be in contact with at least one part of corresponding one of the light source units 20. Each heat-radiating member 24 is made of a material such as a metal material having a thermal conductivity higher than that of air. For example, each heat-radiating member 24 is provided so that the heat-radiating member 24 can move with the movement of the light-source unit 20 in a range of the movement of the light source unit 20 relative to a fulcrum of the aiming mechanism, and that the heat-radiating member 24 is disposed at a sufficient distance from the lamp body 14 to adjust the optical axis of the light source unit 20. The heat-radiating members 24 may be made of a metal material so as to be integrated with one another. In this case, heat can be radiated efficiently from the whole of the heat-radiating members 24.

For example, the extension reflector 28 is a reflection mirror formed of a thin metal plate so as to extend from lower portions of the light source units 20 to the cover 12. When the extension reflector 28 is formed so that at least one part of the inner surface of the lamp body 14 is covered with the extension reflector 28, the shape of the inner surface of the lamp body 14 can be concealed to improve the external appearance of the vehicle front lamp 10.

At least one part of the extension reflector 28 is in contact with the light source units 20 and/or the heat-radiating members 24. In this case, the extension reflector 28 serves as a heat-conducting member for transmitting heat generated by the LED modules 100 to the cover 12. Accordingly, the extension reflector 28 radiates heat from the LED modules 100. A part of the extension reflector 28 is fixed to the cover 12 or the lamp body 14. The extension reflector 28 may be formed as a frame for covering the upper, lower and sides of the light source units 20.

According to this example, when the LED module 100 is used as a light source, the size of the light source unit 20 can be reduced. Moreover, for example, the vehicle front lamp 10 with good design can be provided because the degree of freedom for the arrangement of the light source units 20 is improved.

Figure 3:
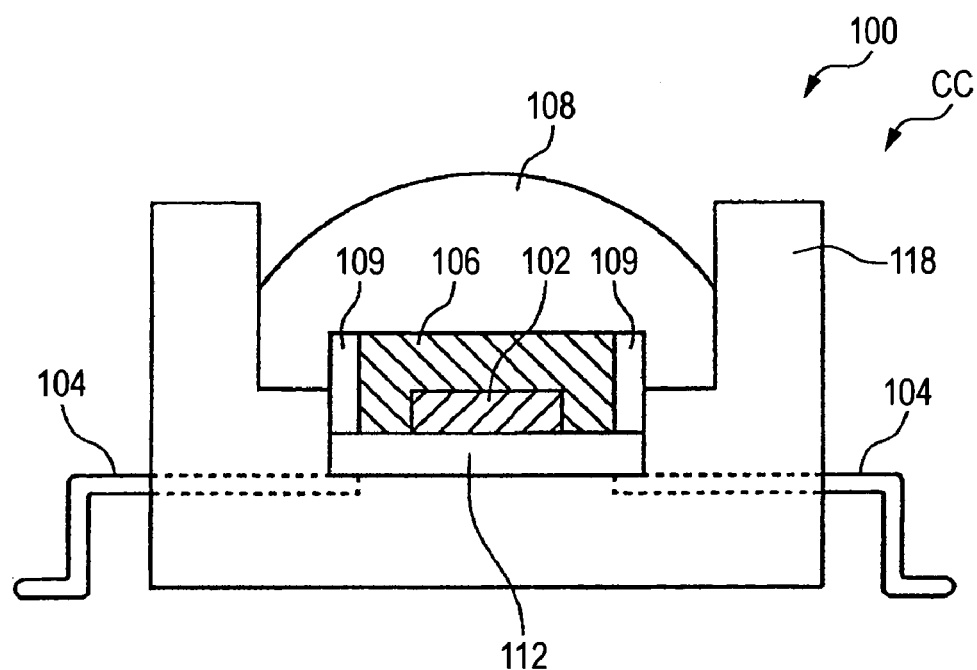
FIG. 3 is a sectional view of an LED module 100 taken along the line C-C in FIG. 4.
Figure 4:
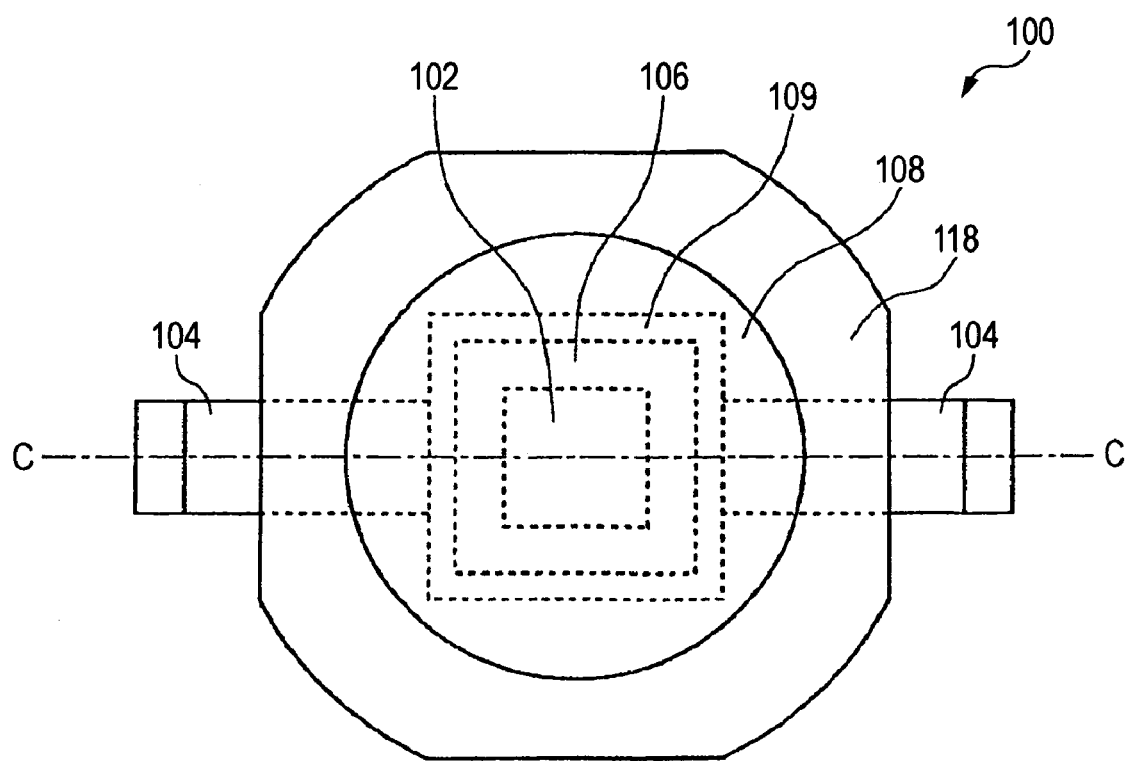
FIG. 4 is a top view of the LED module 100.

FIGS. 3 and 4 show an example of configuration of the LED module 100. FIG. 3 is a sectional view of the LED module 100 taken along the C-C line in FIG. 4. FIG. 4 is a top view of the LED module 100. The LED module 100 has a substrate 112, electrodes 104, a cavity 109, a retention portion 118, a sealing member 108, a light-emitting diode element 102, and a fluorescent portion 106 corresponding to a stratiformly binder portion which consists of a binder component in which the nano -particles and the fluorescent substance are held.

The substrate 112 has a plate-like body. The light-emitting diode element 102 is placed and fixed on an upper surface of the substrate 112. The substrate 112 includes wiring for electrically connecting the light-emitting diode element 102 to the electrodes 104, so that electric power received from the electrodes 104 is supplied to the light-emitting diode element 102. The electrodes 104 supply electric power received from the outside of the LED module 100 to the light-emitting diode element 102 through the substrate 112. The cavity 109 is a cavity formed so as to surround the light-emitting element 102 on the substrate 112. The fluorescent portion 106 is held in the cavity 109.

The retention portion 118 retains the electrodes 104, the substrate 112, the cavity 109 and the sealing member 108. At least one part of the retention portion 118 is made of a material such as a metal material having a thermal conductivity higher than that of air, so that heat generated by the light-emitting diode element 102 is transmitted to the outside of the LED module 100.

The light-emitting diode element 102 is an example of the semiconductor light-emitting element in this invention. The light-emitting diode element 102 generates ultraviolet light in accordance with electric power received from the outside of the LED module 100 through the electrodes 104 and the substrate 112. As another example, the light-emitting diode element 102 may generate blue light instead of ultraviolet light.

The fluorescent portion 106 is provided for covering a surface of the light-emitting diode element 102 when the cavity 109 is filled with the fluorescent portion 106. The fluorescent portion 106 generates visible light such as white light, red light, green light, yellow light, orange light or blue light in accordance with the ultraviolet light generated by the light-emitting diode element 102. Incidentally, when the light-emitting diode element 102 generates blue light, the fluorescent portion 106 may generate yellow light complementary to blue in accordance with the blue light generated by the light-emitting diode element 102. In this case, the LED module 100 generates white light on the basis of the blue light generated by the light-emitting diode element 102 and the yellow light generated by the fluorescent portion 106.

The sealing member 108 is a mold for sealing the light-emitting diode element 102 and the fluorescent portion 106. The sealing member 108 is made of a material capable of transmitting visible light and is disposed opposite to the light-emitting diode element 102 with respect to the fluorescent portion 106. Accordingly, light generated by the fluorescent portion 106 passes through the sealing member 108 and goes out of the LED module 100. According to this example, the LED module 100 can radiate generated light to the outside appropriately.

As another example, the LED module 100 may have a plurality of light-emitting diode elements 102. In this case, the fluorescent portion 106 is provided, for example, in common to the light-emitting diode elements 102 so as to surround the light-emitting diode elements 102. The sealing member 108 seals the light-emitting diode elements 102 and the fluorescent portion 106.

Figure 5:
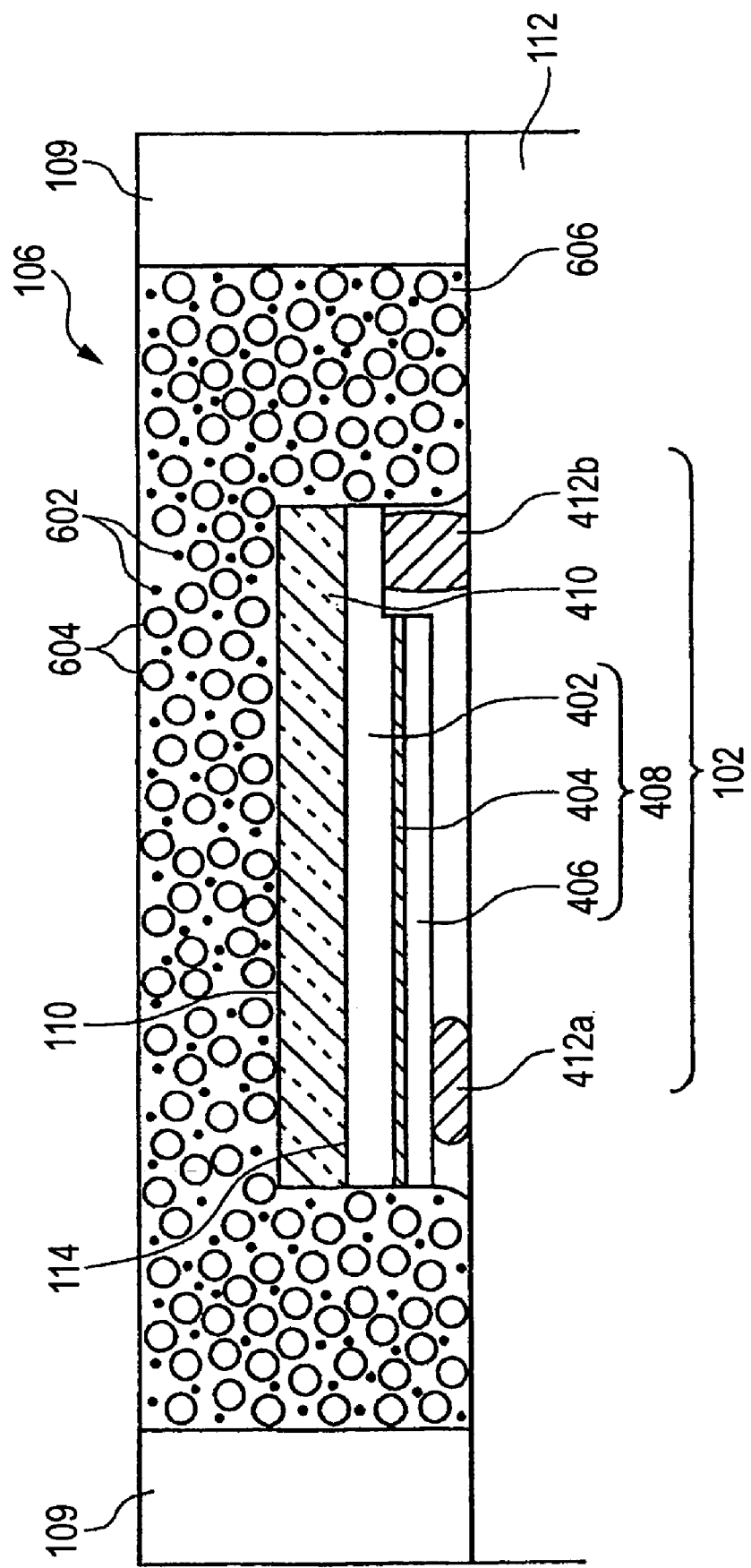
FIG. 5 is a view showing an example of detailed configuration of a light-emitting diode element 102 and a fluorescent portion 106.

FIG. 5 shows an example of detailed configuration of the light-emitting diode element 102 and the fluorescent portion 106 in connection with the substrate 112 and the cavity 109. Incidentally, a ratio different from the actual ratio is used as a ratio of sizes of respective portions for the sake of convenience of description. In this example, the light-emitting diode element 102 has a semiconductor layer 408, a sapphire substrate 410, and electrodes 412*a* and 412*b*. For example, the light-emitting diode element 102 is mounted as a flip chip on the substrate 112 so that the sapphire substrate 410 and the substrate 112 are disposed opposite to each other with respect to the semiconductor layer 408. For example, the electrodes 412*a* and 412*b* are solder bumps for electrically connecting the semiconductor layer 408 to the substrate 112.

Light generated by the semiconductor layer 408 is transmitted through the sapphire substrate 410 toward the sealing member 108. The sapphire substrate 410 radiates the transmitted light from a counter surface 110 facing the sealing member 108 to the fluorescent portion 106. For example, the counter surface 110 is a flat surface about 1 mm square.

The semiconductor layer 408 is formed by crystal growth on a rear surface 114 of the sapphire substrate 410 opposite to the counter surface 110. The semiconductor layer 408 generates light toward the sapphire substrate 410. In this example, the semiconductor layer 408 has an n-type GaN layer 402, an InGaN layer 404, and a p-type GaN layer 406. The n-type GaN layer 402, the InGaN layer 404 and the p-type GaN layer 406 are laminated successively on the rear surface 114 of the sapphire substrate 410. The semiconductor layer 408 may have further layers between these layers.

In this example, the semiconductor layer 408 generates ultraviolet light, for example, with a wavelength of 360 nm to 380 nm toward the sapphire substrate 410 in accordance with electric power received through the electrodes 412*a* and 412*b* and the substrate 112. Accordingly, the light-emitting diode element 102 uses the counter surface 110 of the sapphire substrate 410 as a light-emitting surface for generating ultraviolet light toward the fluorescent portion 106. As another example, the semiconductor layer 408 may generate blue light toward the sapphire substrate 410.

The fluorescent portion 106 has nano-particles 602, fluorescent substances 604, and a binder 606. In this example, the fluorescent portion 106 has kinds of fluorescent substances 604 for generating light with different colors respectively. For example, the binder 606 is made of a silicone resin or a fluorocarbon resin so that the counter surface 110 as the light-emitting surface of the light-emitting diode element 102 is covered with the binder 606. The binder 606 includes the nano-particles 602 and the fluorescent substances 604 in its inside. Accordingly, the binder 606 is formed stratiformly so as to cover the light-emitting surface of the light-emitting diode element 102 and holds the nano-particles 602 and the fluorescent substances 604. Incidentally, the nano-particles 602 and the fluorescent substances 604 may be dispersed into the binder 606 so as to have uniform density. Alternatively, the fluorescent portion 106 may have a single kind of fluorescent substance 604. For example, when the light-emitting diode element 102 generates blue light, the fluorescent portion 106 may have a fluorescent substance 604 for generating yellow light in accordance with the blue light.

Each of the particles of the fluorescent substance 604 has a diameter, for example, of 50 μm. The fluorescent substances 604 generate visible light in accordance with ultraviolet light generated by the light-emitting diode element 102. For example, the kinds of fluorescent substances 604 generate white light, red light, green light, yellow light, orange light and blue light respectively in accordance with the ultraviolet light generated by the light-emitting diode element 102.

Figure 6:
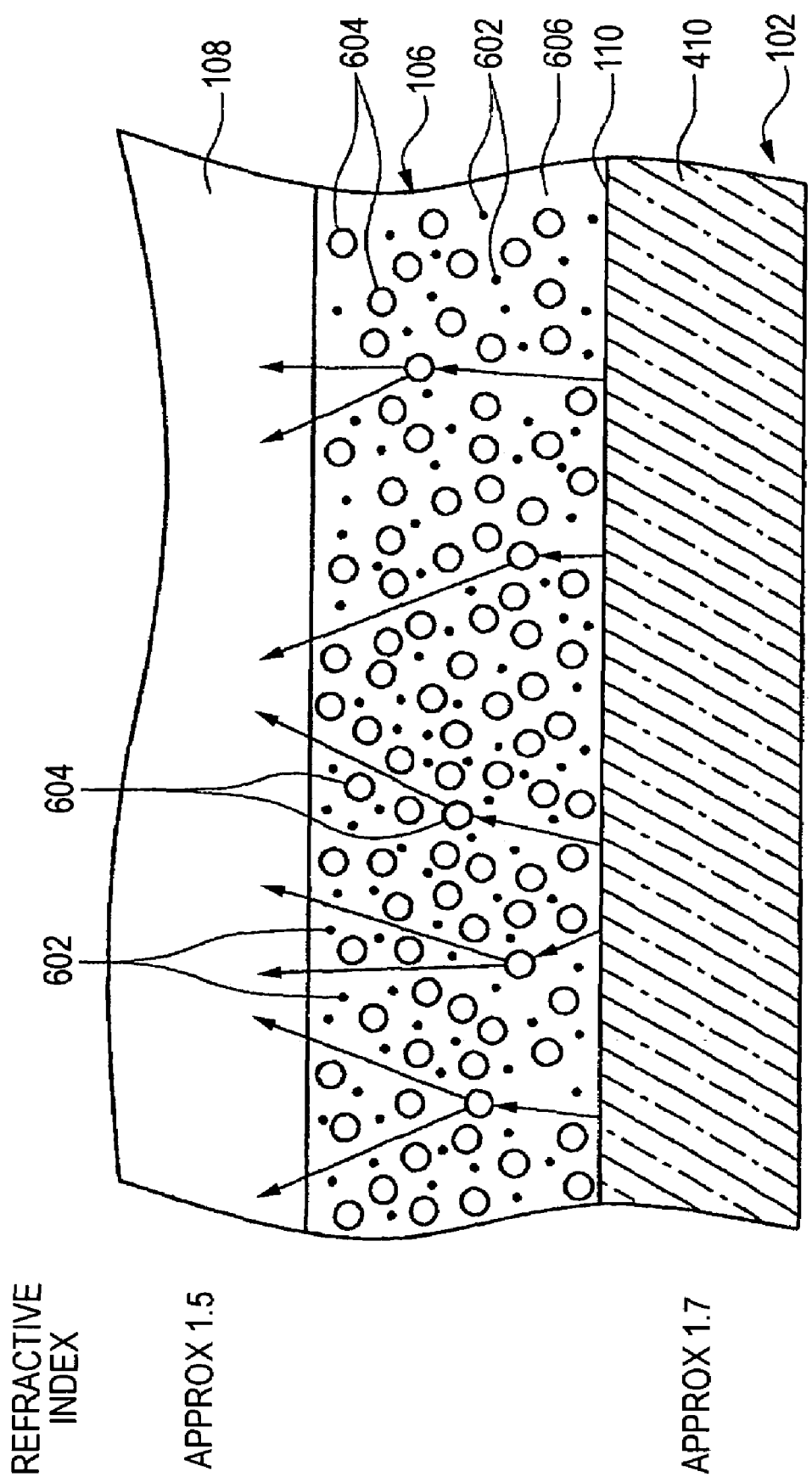
FIG. 6 is a view for explaining a sealing member 108 in more detail.

FIG. 6 is a view for explaining the sealing member 108 in more detail. The sealing member 108 is formed to cover the fluorescent portion 106 and the light-emitting diode element 102 to thereby seal the fluorescent portion 106 and the light-emitting diode element 102. In this example, the sealing member 108 is provided opposite to the sapphire substrate 410 with respect to the fluorescent portion 106. In this example, the sapphire substrate 410 has a refractive index of about 1.7. In this example, the sealing member 108 is made of an epoxy resin and has a refractive index of about 1.5. For example, the epoxy resin may be bisphenol A epoxy (transparent epoxy), biphenyl epoxy, alicyclic epoxy, etc.

The light-emitting diode elements 102 in the vehicle front lamp 10 may emit light, for example, with efficiency of 50 lm/W or more. In this case, the illuminance of ultraviolet light generated by the light-emitting diode elements 102 may be, for example, 10000-20000 times as high as that of sunlight. Accordingly, if the material of the binder 606 has low light resistance to ultraviolet light, there is a possibility that yellowing, cracking, and so on, will occur in the binder 606. In this case, lowering of luminous flux, change of emission color, and so on, may occur. As a result of eager examination to avoid this disadvantage, it has been found that a silicone resin or fluorocarbon resin containing a single substituent or a plurality of substituents selected from substituents containing no aromatic substituent in their high-molecular side chains is preferred as the material having high light resistance to ultraviolet light, that a silsesquioxane resin is further preferred. The silsesquioxane resin preferably includes silicone compounds represented by following chemical formula 1 as monomer compounds, and more preferably, the monomer components, which correspond to the silicone compounds represented by the chemical formula 1 at n=3 and 4, is 20 wt % or more.

$$R_{(4-n)}\text{—SiX}_n \qquad \text{(chemical formula 1)}$$

Note that R is a substituent containing an H atom or an F, B, N, Al, P, Si, Ge or Ti atom or an organic group having 1-50 carbon atoms, X is a hydrolytic group inclusive of a halogen atom such as a Cl atom, etc. and an alkoxy group such as a methoxy group, an ethoxy group, etc., and n is an integer of 0 to 4.

Preferred examples of the substitute other than the aromatic substitute include hydrogen, alkyl group, amino group, carboxyl group, and halogen. The silicone resin may be a high molecule or may be a polymer of low molecules.

Preferred examples of the silicone resin include organosiloxane, silicone oil, silicone grease, silicone rubber, phlorosilicone, polysilane, organohalosilane, and silane coupling agent.

For example, compounds represented by the following chemical formula 2 are preferred.

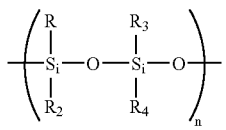

(chemical formula 2)

The preferred silsesquioxane resin is represented by [RSiO$_{3/2}$]n or [RSi(OH)O$_{2/2}$]m[RSiO$_{3/2}$]n. Note that R is a substituent except an aromatic substituent and may be a single substituent or a combination of different kinds of substituents.

In the silicone compound represented by the chemical formula 1: R$_{(4-n)}$—SiX$_n$, X in the chemical formula 1 is not limited in kind if it is a hydrolytic group. Examples of X include a hydroxyl group, halogen such as chlorine, an alkoxy group such as a methoxy group or an ethoxy group, an acetoxy group, an oxime group, an amide group, a propenoxy group, etc.

Specific examples of the silicone compound include tetramethoxysilane Si(OCH$_3$)$_4$, tetraethoxysilane Si(OC$_2$H$_5$)$_4$, trimethoxysilane HSi(OCH$_3$)$_3$, triethoxysilane HSi(OC$_2$H$_5$)$_3$, methyltrichlorosilane CH$_3$SiCl$_3$, ethyltrichlorosilane C$_2$H$_5$SiCl$_3$, (CH$_2$Cl)SiCl$_3$, C$_6$H$_5$SiCl$_3$, SiCl$_4$, HSiCl$_3$, CF$_3$C$_2$H$_4$SiCl$_3$, vinyltriethoxysilane, 3-methacryloxypropyltrimethoxysilane, 3-glycidoxypropyltrimethoxysilane, 2-(3, 4-epoxycyclohexyl)ethyltrimethoxysilane, N-2(aminoethyl)-3-aminopropyltrimethoxysilane, 3-aminopropyltriethoxysilane, N-phenyl-3-aminopropyltrimethoxysilane, 3-mercaptopropyltrimethoxysilane, 3-chloropropyltrimethoxysilane, etc.

From the point of view of light resistance, it is preferable that the monomer compound which corresponds the silicone compounds represented by the chemical formula 1 at n=3 and 4 is 20 wt % or more with respect to the total binder amount.

The fluorocarbon resin is not limited in kind if it is a resin containing a fluorine atom. Preferred examples of the fluorocarbon resin include polytetrafluoroethylene (PTFE), tetrafluoroethylene or hexafluoropropylene copolymer (FEP), tetrafluoroethylene or perfluoroalkylvinyl ether copolymer (PFA), polychlorotrifluoroethylene (PCTFE), polyvinyl fluoride-ethylene or tetrafluoroethylene copolymer (ECTFE), vinylidene fluoride (VDF), hexafluoropropylene (HFP), pentafluoropropylene (PFP), perfluoromethylvinyl ether (PFMVE), etc.

According to this example, the silicone resin, the fluorocarbon resin or the silsesquioxane resin containing no aromatic substituent in its high-molecular side chain or material, which includes the silicone compound represented by the chemical formula 1 as monomer compound, can be used for forming the binder 606 having high light resistance to ultraviolet light. Moreover, for example, the silicone resin can be formed by a simple process at a low cost and is good in heat stability. According to this example, it is therefore possible to form the binder 606 of high performance at a low cost.

When the silicone resin, the fluorocarbon resin or the silsesquioxane resin containing no aromatic substituent in its high-molecular side chain or the material, which includes the silicone compound represented by the chemical formula 1 as monomer compound, is used as the material of the binder 606, the refractive index of the binder 606 is not higher than 1.5. For example, the refractive index of the binder 606 is in a range of from about 1.3 to about 1.4 and lower than the refractive index (1.7) of the light-emitting diode element 102. (Strictly speaking, among members constituting the light-emitting diode element 102, the refractive index of the light-emitting diode element 102 is a refractive index of a member which forms a boundary surface between the fluorescent portion 106. In this embodiment, for example, a refractive index of the sapphire substrate 410 corresponds to the refractive index of the light-emitting diode element 102. Hereinafter, corresponding expression is the same as the above. In this case, the critical angle in the boundary surface between the binder 606 and the light-emitting diode element 102 becomes lower, so that luminous flux of light incident onto the binder 606 from the light-emitting diode element 102 is lowered. For example, when the refractive index of the binder 606 is 1.4 compared with the case where the refractive index of the binder 606 is substantially equal to that of an epoxy resin, the critical angle is reduced from 30° to 26°. For this reason, the luminous flux of light incident onto the fluorescent portion 106 from the light-emitting diode element 102 is reduced by about 10-15%. Accordingly, the luminous flux of light applied onto the fluorescent substances 604 is reduced, so that the luminous flux of light generated by the LED modules 100 is reduced.

As a result of eager examination to avoid this disadvantage, it has been found that the refractive index of the binder composition can be increased when nano-particles 602 each having a refractive index larger than the refractive index of the material of the binder 606 and each having a diameter considerably smaller than the diameter of each of particles of the fluorescent substances 604, for example, nano-particles 602 each having a diameter not larger than 100 nm are mixed with the binder 606. Accordingly, the critical angle of light incident onto the fluorescent portion 106 from the light-emitting diode element 102 in the boundary surface between the light-emitting diode element 102 and the fluorescent portion 106 becomes high. According to this example, it is therefore possible to reduce reflection of ultraviolet light generated by the light-emitting diode element 102 in the boundary surface between the light-emitting diode element 102 and the fluorescent portion 106. Accordingly, light generated by the light-emitting diode element 102 can be efficiently applied onto the fluorescent substances 604 in the fluorescent portion 106.

Because the diameter of each nano-particle 602 is not larger than 100 nm and smaller than half of the wavelength of light generated by the LED module 100, the visible light generated by the fluorescent substances 604 can pass through the nano-particles 602 without any blocking. Accordingly, the visible light generated by the fluorescent substances 604 can be efficiently radiated to the outside of the LED module 100. Incidentally, it is preferable that the diameter of each of the nano-particles 602 is not larger than 80 nm. In this case, transparency to visible light can be improved so greatly that the visible light generated by the fluorescent substances 604 can be efficiently radiated to the outside of the LED module 100.

Further, it is preferable that the refractive index of the binder composition, which is increased by adding the nano-particles 602 to the binder, is not larger than the refractive index of the light emitting diode element 102 and not smaller than the refractive index of the sealing member 108.

Refractive Index

The refractive index of the light-emitting diode element 102 used generally is about 1.7 to 2.5 whereas the refractive index of the sealing member 108 made of an epoxy resin is about 1.5. Accordingly, for example, it is preferable that the refractive index of the binder composition is 1.5 or more and 1.7 or less when the refractive index of the light emitting diode element 102 is about 1.7. Another example, it is preferable that the refractive index of the binder composition is 1.5 or more and 2.5 or less when the refractive index of the light emitting diode element 102 is about 2.7. Further example, the refractive index of the binder composition can be 2.5 or more when the refractive index of the light emitting diode element 102 is about more than 2.5. In this case, the light generated by the light-emitting diode element 102 can be made incident onto the fluorescent portion 106 efficiently and the light generated by the fluorescent substances 604 in the fluorescent portion 106 can be made incident onto the sealing member 108 efficiently.

It is preferable that the forbidden bandwidth energy of the nano-particles 602 is not lower than 3.54 eV. In this case, the nano-particles 602 do not absorb visible light inclusive of ultraviolet light with a wavelength not smaller than 350 nm. Accordingly, the nano-particles 602 can radiate the light generated by the light-emitting diode element 102 to the fluorescent substances 604 efficiently and can transmit the light generated by the fluorescent substances 604 to radiate the light to the outside of the fluorescent portion 106 efficiently.

It is preferable that the nano-particles 602 are made of an inorganic compound. Especially, metal oxide, a fluorine compound, sulfide compound or the like is preferred. Specific examples of the preferred material of the nano-particles 602 include: metal oxide such as aluminum oxide, antimony trioxide, beryllium oxide, hafnium dioxide, lanthanum oxide, magnesium oxide, scandium oxide, silicone dioxide, silicone trioxide, tantalum pentaoxide, titanium dioxide, thorium oxide, yttrium oxide and zirconium dioxide, etc.; fluorine compounds such as bismuth trifluoride, cerium fluoride, lanthanum fluoride, lead fluoride, neodymium fluoride, sodium fluoride, calcium fluoride, chiolyte, cryolite, lithium fluoride and magnesium fluoride, etc,; and lead chloride, lead telluride, etc.

The refractive index of the binder composition can be increased by adding the nano-particles 602 of which refractive index is higher than that of the binder itself. However, the refractive index of the binder composition cannot be increased higher than that of the nano-particles 602. Therefore, in order to increase the refractive of the binder composition higher than that of the sealing member 108, it is preferable to add the nano-particles of which refractive index is higher than that of the sealing member 108. For example, the refractive index of the sealing member 108 made of epoxy resin is about 1.5, when the refractive index of the sealing member is about 1.5, it is preferable to add the nano-particles 602 of which refractive index is 1.5 or more.

For example, the nano-particles 602 may be produced by a break-down method in which coarse particles are pulverized by a ball mill, a beads mill, or the like, or by a build-up method such as a plasma vapor phase method, a sol-gel method or a CVD (chemical vapor deposition) method in which particles are produced from raw materials by a chemical reaction or a physical reaction.

Figure 7:
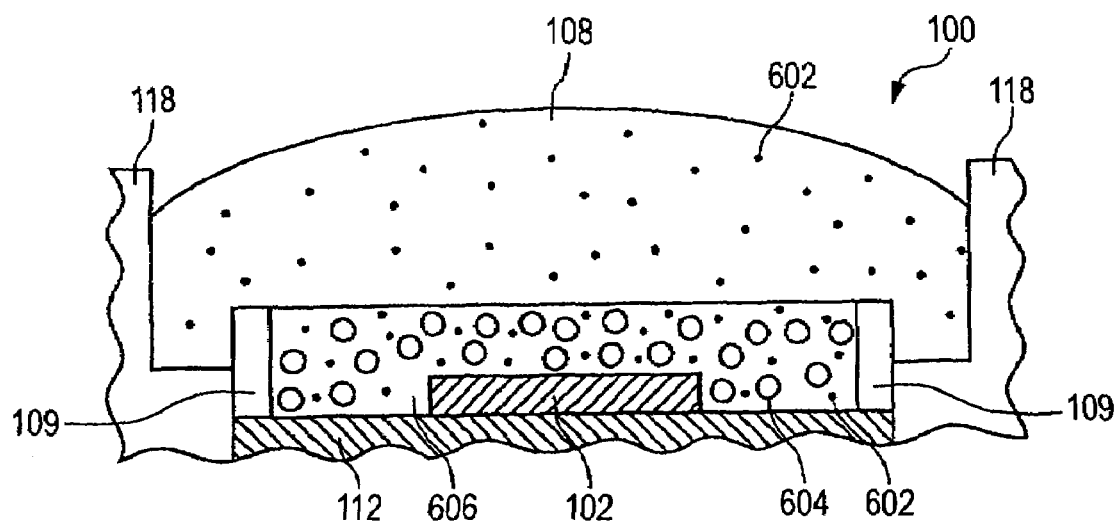
FIG. 7 is a view showing another example of configuration of the fluorescent portion 106 and the sealing member 108.

FIG. 7 shows another example of configuration of the fluorescent portion 106 and the sealing member 108 in connection with the substrate 112 and the cavity 109. Incidentally, in FIG. 7, parts designated by the same numerals as in FIG. 5 have the same or like functions as those of parts shown in FIG. 5 and the description of the parts will be omitted. In this example, the sealing member 108 holds the nano-particles 602. Accordingly, the refractive index of the sealing member 108 becomes higher than the refractive index of the material of the sealing member 108. For this reason, light generated by the fluorescent portion 106 can be made incident onto the sealing member 108 efficiently.

Figure 8:
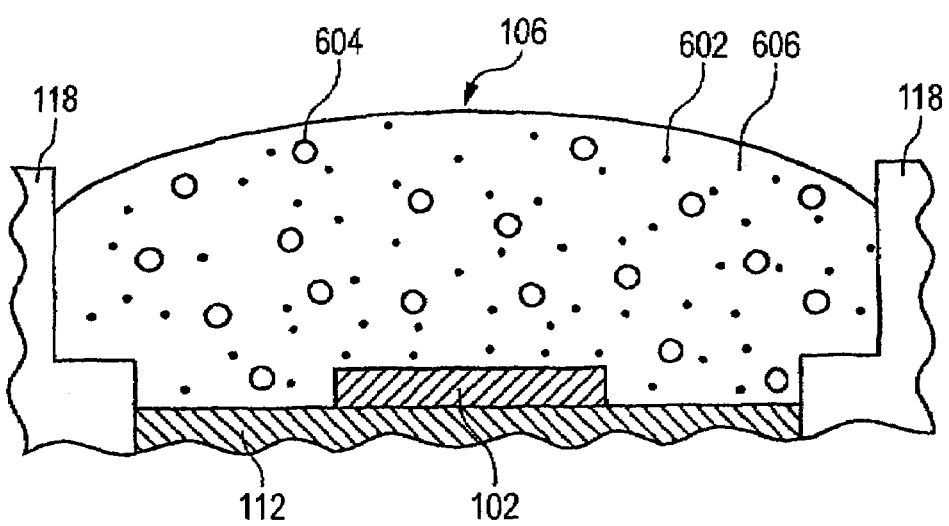
FIG. 8 is a view showing another example of configuration of the fluorescent portion 106.

FIG. 8 shows another example of configuration of the fluorescent portion 106 in connection with the substrate 112 and the cavity 109. Incidentally, in FIG. 8, parts designated by the same numerals as in FIG. 5 have the same or like functions as those of parts shown in FIG. 5 and the description of the parts will be omitted. The fluorescent portion 106 is formed to cover the light-emitting diode element 102 to thereby seal the light-emitting diode element 102. Accordingly, in this example, the fluorescent portion 106 serves as the sealing member 108 described in FIG. 5. Also in this example, the refractive index of the fluorescent portion 106 can be brought close to the refractive index of the sapphire substrate 410 of the light-emitting diode element 102 because the nano-particles 602 are added into the binder 606 in the fluorescent portion 106. For this reason, light generated by the light-emitting diode element 102 can be made incident onto the fluorescent portion 106 efficiently. In addition, light generated by the fluorescent substances 604 in the fluorescent portion 106 can be efficiently radiated to the outside of the LED module 100.

As is obvious from the above description, in accordance with this embodiment, light generated by the light-emitting diode element 102 can be taken out efficiently to thereby provide a vehicle front lamp 10 with high light-emitting efficiency.

Although the present invention has been described on the basis of an embodiment thereof, the technical scope of the present invention is not limited to the scope described in the embodiment. It is obvious to those skilled in the art that various changes or modifications may be made on the embodiment. It is obvious from the scope of claim that such changed or modified embodiments may be included in the technical scope of the present invention.

Examples concerned with the nano-particles and the binder will be described below.

Evaluation was made on the case where the nano-particles and the binder were applied to a semiconductor light-emitting element for emitting blue light and a semiconductor light-emitting element for emitting ultraviolet light, respectively.

The refractive index of the binder composition after addition of the nano-particles into 10% by volume of the binder was calculated based on proportion. The reflectance of the binder composition was calculated in the condition that light was incident onto the binder composition perpendicularly from the light-emitting element having a refractive index of 1.77.

The light emitted from the light-emitting element incidents to the binder 606, then wavelength of the light is converted at the fluorescent substance 604 and white light is obtained at outside of the LED module 100. When obtaining the light from the light-emitting element to the outside of the light-emitting module, the light should pass through four boundary surfaces, which are among the light-emitting element, the binder, the fluorescent substance, the sealing member and air (outside), for example. A part of the light reflects on the each boundary surface and the efficiency of the obtaining the light becomes deteriorated. It is very important to suppress the reflective index on the boundary between the light-emitting element and the binder, through which the light passes at first, lower in order to increase the efficiency of obtaining the light.

Linear light transmittance was obtained in such a manner that light transmittance in the wavelength of light generated by the semiconductor light-emitting element was measured by a spectral transmittance meter. The semiconductor light-emitting element for emitting blue light was measured at 460 nm whereas the semiconductor light-emitting element for emitting ultraviolet light was measured at 360 nm.

The nano-particles and the binder were weighed in volume proportion of 10:90 and dispersed and mixed while a solvent was added thereto. The dispersion thus prepared was applied onto silica glass by a spin coater to form a 3 μm-thick film. The film was heated at 150° C. for an hour to prepare a measurement sample.

Examples 1 and 2 and Comparative Examples 1 to 3 were evaluated on the assumption that the sample was applied to a light-emitting element for emitting blue light (460 nm).

---

[Example 1]
Nano-Particles: aluminum oxide C (made by NIPPON AEROSIL CO., LTD.)

particle size 13 nm, refractive index 1.77,
forbidden band width energy 8.3 eV
  Binder: phenylsilicone compound (made by GELEST, INC.)
    (thermally bridged substance of the following mixture)

| | |
|---|---|
| Vinyl-terminal diphenylsiloxane-dimethylsiloxane copolymer: | 94.92 wt % |
| Curing catalyst: SIP6831.2: | 0.08 wt % |
| Crosslinker: HMS-301: | 5.00 wt % |
| Refractive index | 1.53 |

[Example 2]
Nano-Particles: titanium oxide P25 (made by NIPPON AEROSIL CO., LTD.)

particle size 21 nm, refractive index 2.50,
forbidden band width energy 3.2 eV
  Binder: phenylsilicone compound (made by GELEST, INC.)
    (thermally bridged substance of the following mixture)

| | |
|---|---|
| Vinyl-terminal diphenylsiloxane-dimethylsiloxane copolymer: | 94.92 wt % |
| Curing catalyst: SIP6831.2: | 0.08 wt % |
| Crosslinker: HMS-301: | 5.00 wt % |
| Refractive index | 1.53 |

[Comparative Example 1]
Nano-Particles: not added
  Binder: phenylsilicone compound (made by GELEST, INC.)
    (thermally bridged substance of the following mixture)

| | |
|---|---|
| Vinyl-terminal diphenylsiloxane-dimethylsiloxane copolymer: | 94.92 wt % |
| Curing catalyst: SIP6831.2: | 0.08 wt % |
| Crosslinker: HMS-301: | 5.00 wt % |
| Refractive index | 1.53 |

[Comparative Example 2]
Nano-Particles: silica AEROSIL380 (made by NIPPON AEROSIL CO., LTD.)

particle size 7 nm, refractive index 1.45,
forbidden band width energy 6.2 eV
  Binder: phenylsilicone compound (made by GELEST, INC.)
    (thermally bridged substance of the following mixture)

| | |
|---|---|
| Vinyl-terminal diphenylsiloxane-dimethylsiloxane copolymer: | 94.92 wt % |
| Curing catalyst: SIP6831.2: | 0.08 wt % |
| Crosslinker: HMS-301: | 5.00 wt % |
| Refractive index | 1.53 |

[Comparative Example 3]
Nano-Particles: silica AEROSIL380 (made by NIPPON AEROSIL CO., LTD.)

particle size 7 nm, refractive index 1.45,
forbidden band width energy 6.2 eV
  Binder: LED epoxy sealing material NT-8405 (made by NITTO DENKO CORPORATION)

| | |
|---|---|
| Refractive index | 1.53 |

---

Table 1 shows properties of Examples 1 and 2 and Comparative Examples 1 to 3.

As is obvious from Example 1 and Comparative Example 1, the Example 1 is useful because the reflective index between the binder composition and the light-emitting diode element becomes lower by adding the nano-particles, and transmittance of light generated by the semiconductor light-emitting element remains 90%.

As described in Examples 1 and 2, when the refractive index of the nano-particles is set to be higher than the refractive index of the binder, reflectance is reduced, therefore, the Examples 1 and 2 are useful.

However, since in the Comparative Example 2 and 3, the nano-particles, of which refractive index is lower than the binder, are used, compare the refractive and reflective index of the binder composite with the Comparative Example 1, the refractive index becomes lower and the reflective index becomes higher.

---

[Example 3]
Nano-Particles: aluminum oxide C (made by NIPPON AEROSIL CO., LTD.)

particle size 13 nm, refractive index 1.77,
forbidden band width energy 8.3 eV
  Binder: dimethylsilicone compound (made by GELEST, INC.)
    (thermally bridged substance of the following mixture)

| | |
|---|---|
| Vinyl-terminal dimethylsiloxane polymer: | 94.92 wt % |
| Curing catalyst: SIP6831.2: | 0.08 wt % |
| Crosslinker: HMS-301: | 5.00 wt % |
| Refractive index | 1.40 |

[Example 4]
Nano-Particles: aluminum oxide C (made by NIPPON AEROSIL CO., LTD.)

particle size 13 nm, refractive index 1.77,
forbidden band width energy 8.3 eV
  Binder: polymethylsilsesquioxane (made by GELEST, INC.)

| | |
|---|---|
| Refractive index | 1.42 |

[Example 5]
Nano-Particles: aluminum oxide C (made by NIPPON AEROSIL CO., LTD.)

particle size 13 nm, refractive index 1.77,
forbidden band width energy 8.3 eV
  Binder: silicone compound (thermally bridged substance of the following mixture)

| | |
|---|---|
| Tetramethoxysilane: | 84 wt % |
| 0.1N-hydrochloric acid: | 16 wt % |
| Refractive index | 1.41 |

[Example 6]
Nano-Particles: aluminum oxide C (made by NIPPON AEROSIL CO., LTD.)

particle size 130 nm, refractive index 1.77,
forbidden band width energy 8.3 eV
  Binder: dimethyl silicone compound (thermally bridged substance of the following mixture)

| | |
|---|---|
| Vinyl-terminal dimethylsiloxane polymer: | 94.92 wt % |
| Curing catalyst: SIP6831.2: | 0.08 wt % |
| Crosslinker: HMS-301: | 5.00 wt % |
| Refractive index | 1.40 |

[Comparative Example 4]
Nano-Particles: titanium oxide P25 (made by NIPPON AEROSIL CO., LTD.)

particle size 21 nm, refractive index 2.50,
forbidden band width energy 3.2 eV
  Binder: dimethylsilicone compound (made by GELEST, INC.)
    (thermally bridged substance of the following mixture)

| | |
|---|---|
| Dimethylsiloxane polymer: | 94.92 wt % |
| Curing catalyst: SIP6831.2: | 0.08 wt % |
| Crosslinker: HMS-301: | 5.00 wt % |
| Refractive index | 1.40 |

-continued

[Comparative Example 5]
Nano-Particles: aluminum oxide C
(made by NIPPON AEROSIL CO., LTD.)

particle size 13 nm, refractive index 1.77,
forbidden band width energy 8.3 eV
  Binder: phenylsilicone compound (made by GELEST, INC.)
  (thermally bridged substance of the following mixture)

| | |
|---|---|
| Vinyl-terminal diphenylsiloxane-dimethylsiloxane copolymer: | 94.92 wt % |
| Curing catalyst: SIP6831.2: | 0.08 wt % |
| Crosslinker: HMS-301: | 5.00 wt % |
| Refractive index | 1.53 |

[Comparative Example 6]
Nano-Particles: aluminum oxide C
(made by NIPPON AEROSIL CO., LTD.)

particle size 13 nm, refractive index 1.77,
forbidden band width energy 8.3 eV
  Binder: LED epoxy sealing material NT-8405
  (made by NITTO DENKO CORPORATION)

| | |
|---|---|
| Refractive index | 1.53 |

In Examples 3 to 6 and Comparative Examples 4 to 6, evaluation was made on the assumption that the sample was applied to a semiconductor light-emitting element for emitting ultraviolet light. A light resistance test was performed in prediction that photo-deterioration of members would become severe because of ultraviolet light. Table 2 shows properties of Examples 3 to 6, and Comparative Examples 4 to 6.

In the light resistance test, in the condition that the sample was irradiated with ultraviolet light having a wavelength of 360 nm and an illuminance of 10 W/cm², linear light transmittance at 360 nm was measured and the time of retention smaller than 70% compared with an initial stage of light irradiation was regarded as the lifetime.

In Comparative Examples 5 and 6, when the sample was applied to a semiconductor light-emitting element for emitting blue light, reflectance is low, preferably. In Comparative Example 5, when the sample was applied to a semiconductor light-emitting element for emitting ultraviolet light, linear light transmittance was reduced by absorption of light generated by the semiconductor light-emitting element because the forbidden band width energy of the nano-particles was so lower than 3.54 eV.

In Comparative Example 6, the refractive index of the binder was 1.53 and reflectance became low but the binder was decomposed by absorption of ultraviolet light because the binder had an aromatic substituent. As a result, the lifetime in the light resistance test was shortened extremely.

Examples 3 to 5 were characterized in addition to Examples 1 and 2 in that the forbidden band width energy was not lower than 3.54 eV and/or the refractive index of the binder was not higher than 1.5. In Examples 3 to 5, high-efficiency long-lived light-emitting modules can be provided.

Further, in Example 6, the nano-particles, of which diameter is larger than that of the nano-particles in Example 3, are used. The nano-particles are rather aggregating each other by adhesion of each particle. Therefore, in general, the particles are dispersed by dispersion such as homogenizer, ball mill and supersonic homogenizer. In Example 6, the nano-particles are used in a condition that the dispersion is stopped in its halfway, and the particles are a little aggregating. Particle diameter is measured by dynamic light scattering particle distribution measure, and median diameter is measured as the particle diameter. It is obvious that Example 6 is superior to the Comparative Examples 5 to 7 in light resist examination. Also, since the particle diameter of Example 6 is larger than that of Example 3, light scattering is occurred and the liner light transmittance becomes lowered barely.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

TABLE 1

EXAMPLE (applied to a semiconductor light-emitting element for emitting blue light)

| | Comparative Example 1 | Comparative Example 2 | Comparative Example 3 | Example 1 | Example 2 |
|---|---|---|---|---|---|
| Nano-particles Kind | — | Silica | Silica | Alumina | Titania |
| Nano-particles Product Name | — | AEROSIL380 | AEROSIL380 | Aluminum oxide C | Titanium oxide P25 |
| Nano-particles Particle Size [nm] | — | 7 | 7 | 13 | 21 |
| Nano-particles Refractive Index nd[—] | — | 1.45 | 1.45 | 1.77 | 2.5 |
| Nano-particles Forbidden Band Width Energy [eV] | — | 6.2 | 6.2 | 8.3 | 3.2 |
| Binder Kind | Phenyl-silicone | Phenyl-silicone | Epoxy | Phenyl-silicone | Phenyl-silicone |
| Binder Refractive Index nd[—] | 1.53 | 1.53 | 1.53 | 1.53 | 1.53 |
| Binder Composition Refractive Index nd[—] | 1.53 | 1.51 | 1.51 | 1.58 | 1.72 |
| Reflectance 1)[%] | 0.53 | 0.61 | 0.61 | 0.33 | 0.02 |
| Linear Light Transmittance (at 460 nm) [%] | 91 | 91 | 85 | 90 | 88 |

1) Reflectance was calculated on the assumption that light emitted from the light-emitting element (nd = 1.77) was perpendicularly incident onto the resin composition.
Calculation formula: Reflectance = ((refractive index of composition − 1.77)/(refractive index of composition + 1.77))^2*100

TABLE 2

EXAMPLE (applied to a semiconductor light-emitting element for emitting ultraviolet light)

| | Comparative Example 4 | Comparative Example 5 | Comparative Example 6 | Example 3 | Example 4 | Example 5 | Example 6 |
|---|---|---|---|---|---|---|---|
| Nano-particles Kind | Titania | Alumina | Alumina | Alumina | Alumina | Alumina | Alumina |
| Nano-particles Product Name | Titanium oxide P25 | Aluminum oxide C | Aluminum oxide C | Aluminum oxide C | Aluminum oxide C | Titanium oxide C | Aluminum oxide C |
| Nano-particles Particle Size [nm] | 21 | 13 | 13 | 13 | 13 | 13 | 130 |
| Nano-particles Refractive Index nd[−] | 2.5 | 1.77 | 1.77 | 1.77 | 1.77 | 1.77 | 1.77 |
| Nano-particles Forbidden Band Width Energy [eV] | 3.2 | 8.3 | 8.3 | 8.3 | 8.3 | 8.3 | 8.3 |
| Binder Kind | Dimethyl-silicone | Phenyl-silicone | Epoxy | Dimethyl-silicone | Silsesquioxane | Silicone compound (n >= 3) | Dimethyl-silicone |
| Binder Refractive Index nd[−] | 1.53 | 1.53 | 1.53 | 1.40 | 1.42 | 1.41 | 1.40 |
| Binder Composition Refractive Index nd[−] | 1.72 | 1.58 | 1.58 | 1.47 | 1.49 | 1.48 | 1.47 |
| Reflectance 1)[%] | 0.02 | 0.33 | 0.33 | 0.83 | 0.74 | 0.78 | 0.83 |
| Linear Light Transmittance (at 360 nm) [%] | 35.0 | 87.0 | 87.0 | 88.0 | 88.0 | 88.0 | 85.0 |
| Light Resistance Test [hr] | 3,000 | 100 | 10 | 3,000 | 4,000 | 5,000 | 3,000 |

1) Reflectance was calculated on the assumption that light emitted from the light-emitting element (nd = 1.77) was perpendicularly incident onto the resin composition.
Calculation formula: Reflectance = ((refractive index of composition − 1.77)/(refractive index of composition + 1.77))^2*100

What is claimed is:

1. A light source module for generating light, comprising:
a semiconductor light-emitting element operable to generate light;
a nano-particle having a diameter which is smaller than half wavelength of the light generated by the light source module;
a fluorescent substance for generating visible light in accordance with the light generated by the semiconductor light-emitting element; and
a stratiformly binder which covers a light-emitting surface of the semiconductor light-emitting element and holds the nano-particle and the fluorescent substance,
wherein a refractive index of the nano-particles is higher than a refractive index of the binder,
wherein the refractive index of the binder is 1.5 or less,
wherein the semiconductor light-emitting element generates ultraviolet light, the fluorescent substance generates visible light in accordance with the ultraviolet light generated by the semiconductor light-emitting element, the binder is made of silsesquioxane resin and a side chain of the silsesquioxane resin is a single substituent or a plurality of substituents selected from at least one of non-aromatic substituents, and
wherein the silsesquioxane resin is selected from at least one of $[RSiO_{3/2}]n$ or $[RSi(OH)O_{2/2}]m[RSiO_{3/2}]n$, wherein R is a substituent except an aromatic substituent and m and n is an integer.

2. The light source module according to claim 1, wherein the substituent is selected from at least one of alkyl group, amino group, carboxyl group, and halogen.

3. The light source module according to claim 1, wherein a refractive index of the nano-particle is larger than a refractive index of the sealing member.

4. A light source module for generating light, comprising:
a semiconductor light-emitting element operable to generate light;
a nano-particle having a diameter which is smaller than half wavelength of the light generated by the light source module;
a fluorescent substance for generating visible light in accordance with the light generated by the semiconductor light-emitting element; and
a stratiformly binder which covers a light-emitting surface of the semiconductor light-emitting element and holds the nano-particle and the fluorescent substance,
wherein a refractive index of the nano-particles is higher than a refractive index of the binder,
wherein the refractive index of the binder is 1.5 or less and
wherein the semiconductor light-emitting element generates ultraviolet light, the fluorescent substance generates visible light in accordance with the ultraviolet light generated by the semiconductor light-emitting element; the binder includes a monomer component of silicone compound represented by chemical formula: $R_{(4-n)}\text{-}SiX_n$ which R is a substituent containing an H atom or an F, B, N, Al, P, Si, Ge or Ti atom or an organic group having 1-50 carbon atoms, X is a hydrolytic group and n is an integer of 0 to 4; and
wherein a ratio of the monomer component which corresponds to the silicone compound represented by the chemical formula at n=3 and 4 is 20 wt % or more.

5. The light source module according to claim 4, wherein the silicone compound is selected from at least one of tetramethoxysilane $Si(OCH_3)_4$, tetraethoxysilane $Si(OC_2H_5)_4$, trimethoxysilane $HSi(OCH_3)_3$, triethoxysilane $HSi(OC_2H_5)_3$, methyltrichlorosilane $CH_3SiCl_3$, ethyltrichlorosilane $C_2H_5SiCl_3$, $(CH_2Cl)SiCl_3$, $C_6H_5SiCl_3$, $SiCl_4$, $HSiCl_3$, $CF_3C_2H_4SiCl_3$, vinyltriethoxysilane, 3-methacryloxypropyltrimethoxysilane, 3-glycidoxypropyltrimethoxysilane, 2-(3,4-epoxycyclohexyl)ethyltrimethoxysilane, N-2-(aminoethyl)-3-aminopropyltrimethoxysilane, 3-aminopropyltriethoxysilane, N-phenyl-3-aminopropyltrimethoxysilane, 3-mercaptopropyltrimethoxysilane and 3-chloropropyltrimethoxysilane.

6. The light source module according to claim 4, wherein the diameter of the nano-particle is 100 nm or less.

7. The light source module according to claim 4, wherein forbidden bandwidth energy of the nano-particle is 3.54 eV or more.

8. The light source module according to claim 4, further comprising:
   a sealing member made of visible light-transmissible material,
   wherein the sealing member holds the nano-particles and covers the binder and the semiconductor light-emitting element so as to seal the binder and the semiconductor light-emitting element.

9. The light source module according to claim 8, wherein the sealing member is made of epoxy resin which is selected from at least one of bisphenol A epoxy (transparent epoxy), biphenyl epoxy and alicyclic epoxy.

10. The light source module according to claim 4, further comprising:
   a sealing member which is made of visible light-transmissible material and covers the binder and the semiconductor light-emitting element so as to seal the binder and the semiconductor light-emitting element,
   wherein the refractive index of the binder, which holds the nano-particle and the fluorescent substance, is smaller than a refractive index of the semiconductor light-emitting element and larger than a refractive index of the sealing member.

11. The light source module according to claim 10, wherein the refractive index of the stratiformly binder, which holds the nano-particle and the fluorescent substance, is 1.5 or more and 2.5 or less.

12. The light source module according to claim 4, wherein the nano-particle is selected from at least one of aluminum oxide, antimony trioxide, beryllium oxide, hafnium dioxide, lanthanum oxide, magnesium oxide, scandium oxide, silicon dioxide, silicon trioxide, tantalum pentaoxide, titanium dioxide, thorium oxide, yttrium oxide, zirconium dioxide, bismuth trifluoride, cerium fluoride, lanthanum fluoride, lead fluoride, neodymium fluoride, sodium fluoride, calcium fluoride, chiolyte, cryolite, lithium fluoride, magnesium fluoride, lead chloride and lead telluride.

13. The light source module according to claim 4, wherein the fluorescent substance generates light which is complementary color with the light generated by the light source module.

* * * * *